(12) United States Patent
Cho (10) Patent No.: US 8,269,234 B2
(45) Date of Patent: Sep. 18, 2012

(54) SEMICONDUCTOR LIGHT-EMITTING DEVICE

(75) Inventor: Ki Hyun Cho, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 173 days.

(21) Appl. No.: 12/709,950

(22) Filed: Feb. 22, 2010

(65) Prior Publication Data

US 2010/0213478 A1 Aug. 26, 2010

(30) Foreign Application Priority Data

Feb. 23, 2009 (KR) .................. 10-2009-0015052

(51) Int. Cl.
 *H01L 33/00* (2010.01)
(52) U.S. Cl. .............. 257/94; 257/103; 257/98; 257/79; 257/E33.013
(58) Field of Classification Search .......... 257/94, 257/103, 53, 72, 79, 222, 225, E27.001, E33.013; 438/24, 26, 28
See application file for complete search history.

(56) References Cited

U.S. PATENT DOCUMENTS

| 6,567,449 B1* | 5/2003 | Ashida ................ 372/50.1 |
| 7,429,750 B2* | 9/2008 | Suehiro et al. ............ 257/53 |
| 7,947,997 B2* | 5/2011 | Jeong .................. 257/98 |
| 8,022,428 B2* | 9/2011 | Jeong .................. 257/98 |
| 2003/0141506 A1 | 7/2003 | Sano et al. |
| 2005/0211997 A1 | 9/2005 | Suehiro et al. |
| 2006/0043384 A1 | 3/2006 | Cho et al. |
| 2007/0194325 A1* | 8/2007 | Sung et al. ............... 257/79 |
| 2008/0087875 A1 | 4/2008 | Fan et al. |
| 2008/0099780 A1 | 5/2008 | Tran |
| 2010/0123149 A1* | 5/2010 | Bae .................. 257/94 |
| 2010/0208763 A1 | 8/2010 | Engl et al. |

FOREIGN PATENT DOCUMENTS

| CN | 1613156 A | 5/2005 |
| CN | 1674313 A | 9/2005 |
| DE | 10 2007 029 370 A1 | 11/2008 |
| DE | 10 2007 035 687 A1 | 2/2009 |
| EP | 1 471 583 A1 | 10/2004 |
| WO | WO 2008/045886 A2 | 4/2008 |
| WO | WO 2008/135013 A2 | 11/2008 |
| WO | WO-2008/154573 A1 | 12/2008 |
| WO | WO 2009/015645 A2 | 2/2009 |

* cited by examiner

*Primary Examiner* — Thao Le
*Assistant Examiner* — Sheng Zhu
(74) *Attorney, Agent, or Firm* — Birch, Stewart, Kolasch & Birch, LLP (57) ABSTRACT

A semiconductor light-emitting device is provided. The semiconductor light-emitting device comprises a plurality of compound semiconductor layers, an electrode layer, and a conductive support member. The compound semiconductor layers comprise a first conductivity type semiconductor layer, an active layer and a second conductivity type semiconductor layer. The electrode layer is disposed under the compound semiconductor layers. The conductive support member is disposed under the electrode layer. Herein, the conductive support member has a thermal expansion coefficient difference within about 50% with respect to the compound semiconductor layer.

10 Claims, 7 Drawing Sheets

SEMICONDUCTOR LIGHT-EMITTING DEVICE

CROSS-REFERENCE TO RELATED APPLICATIONS

The present application claims priority under 35 U.S.C. 119 to Korean Patent Application No. 10-2009-0015052 (filed on Feb. 23, 2009), which is hereby incorporated by reference in its entirety.

BACKGROUND

The present disclosure relates to semiconductor light-emitting devices.

Due to their physical and chemical characteristic, Group III-V nitride semiconductors are being esteemed as core materials for light-emitting devices such as light-emitting diodes (LEDs) and laser diodes (LDs). An example of the Group III-V nitride semiconductors is a nitride semiconductor with a composition equation of $In_xAl_yGa_{1-x-y}N$ ($0 \leq x \leq 1$, $0 \leq y \leq 1$, $0 \leq x+y \leq 1$).

An LED is a kind of semiconductor device that is used as a light source or uses the characteristics of compound semiconductors to converts electricity into light or ultraviolet (UV) rays to exchange signals.

Nitride semiconductor based LEDs or LDs are widely used in light-emitting devices, and are applied as light sources for various products such as keypad light-emitting units of mobile phones, electric light panels, and illumination devices.

SUMMARY

Embodiments provide a semiconductor light-emitting device including a conductive support member having a thermal expansion coefficient similar to the thermal expansion coefficient of a compound semiconductor.

Embodiments provide a semiconductor light-emitting device including a conductive support member having a thermal expansion coefficient similar to the thermal expansion coefficient of a compound semiconductor.

Embodiments provide a semiconductor light-emitting device including a conductive support member having a thermal expansion coefficient difference within in a critical range with respect to a compound semiconductor under a compound semiconductor layer.

An embodiment provides a semiconductor light-emitting device comprising: a plurality of compound semiconductor layers comprising a first conductivity type semiconductor layer, an active layer and a second conductivity type semiconductor layer; an electrode layer under the compound semiconductor layers; and a conductive support member under the electrode layer, wherein the conductive support member has a thermal expansion coefficient difference within about 50% with respect to the compound semiconductor layer.

An embodiment provides a semiconductor light-emitting device comprising: a plurality of compound semiconductor layers comprising a first conductivity type semiconductor layer, an active layer and a second conductivity type semiconductor layer; an electrode on the compound semiconductor layers; an electrode layer under the compound semiconductor layers; and a conductive support member under the electrode layer, wherein the conductive support member comprises an alloy material with a thermal expansion coefficient of about $1 \sim 9 \times 10^{-6}$/K.

An embodiment provides a semiconductor light-emitting device comprising: a plurality of compound semiconductor layers comprising a first conductivity type semiconductor layer, an active layer and a second conductivity type semiconductor layer; an electrode on the compound semiconductor layers; an electrode layer under the compound semiconductor layers; and a conductive support member under the electrode layer, wherein the conductive support member comprises an alloy having a thermal expansion coefficient difference within about 50% with respect to the compound semiconductor layer.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

In the description of embodiments, it will be understood that when a layer (or film), a region, a pattern, or a structure is referred to as being "on/under" a substrate, a layer (or film), a region, a pad, or patterns, it can be directly on the substrate, the layer (or film), the region, the pad, or the patterns, or intervening layers may also be present. Also, the reference about 'on' and 'under' each layer will be made on the basis of the drawings. Also, the dimension of each of elements may be exaggerated for clarity of illustration, and the dimension of each of the elements may be different from the actual dimension of each of the elements. The technical features of each embodiment are not limited to each embodiment and may be selectively applied to another embodiment.

Figure 1:
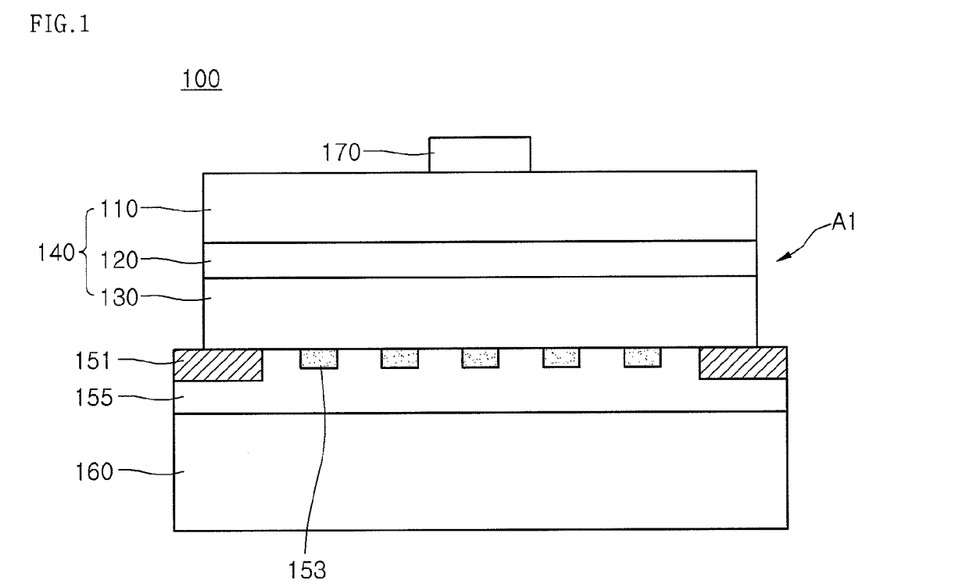
FIG. 1 is a side sectional view of a semiconductor light-emitting device according to an embodiment 1.

FIG. 1 is a side sectional view of a semiconductor light-emitting device according to a first embodiment.

Referring to FIG. 1, a semiconductor light-emitting device 100 includes a plurality of compound semiconductor layers 140, a channel layer 151, an ohmic layer 153, an electrode layer 155, a conductive support member 160, and an electrode 170.

The compound semiconductor layers 140 include a first conductivity type semiconductor layer 110, an active layer 120, and a second conductivity type semiconductor layer 130. The active layer 120 is disposed between the first conductivity type semiconductor layer 110 and the second conductivity type semiconductor layer 130.

The first conductivity type semiconductor layer 110 may include at least one semiconductor layer doped with a first conductivity type dopant. The semiconductor layer may be formed of a Group III-V compound semiconductor selected from the group consisting of GaN, AlN, AlGaN, InGaN, InN, InAlGaN, AlInN, AlGaAs, GaP, GaAs, GaAsP, AlGaInP, and a combination thereof. If the first conductivity type semiconductor layer 110 is an N-type semiconductor layer, the first conductivity type dopant is an N-type dopant and the N-type dopant may include Si, Ge, Sn, Se, or Te.

An electrode 170 of a predetermined pattern is formed on the top of the first conductivity type semiconductor layer 110. A roughness may be formed on some or all of the top of the first conductivity type semiconductor layer 110.

The active layer 120 is formed under the first conductivity type semiconductor layer 110. The active layer 120 is formed to have a single quantum well (SQW) structure or a multiple quantum well (MQW) structure. The active layer 120 is formed of a Group III-V compound semiconductor material to have a period of a well layer and a barrier layer, for example, a period of InGaN well layer/GaN barrier layer or a period of AlGaN well layer/GaN barrier layer, to which the inventive concept is not limited.

The active layer 120 may include a material with a band gap energy depending on the wavelength of an emitted light, for example, a material emitting a color light such as a blue-wavelength light, a red-wavelength light and a green-wavelength light.

A conductive clad layer may be formed on and/or under the active layer. The conductive clad layer may include a GaN-based semiconductor layer.

The second conductivity type semiconductor layer 130 may be formed under the active layer 120. The second conductivity type semiconductor layer 130 may include at least one semiconductor layer doped with a second conductivity type dopant. Herein, the semiconductor layer may be formed of a Group III-V compound semiconductor selected from the group consisting of GaN, AlN, AlGaN, InGaN, InN, InAlGaN, AlInN, AlGaAs, GaP, GaAs, GaAsP, AlGaInP, and a combination thereof. If the second conductivity type semiconductor layer 130 is a P-type semiconductor layer, the second conductivity type dopant is a P-type dopant and the P-type dopant may include Mg, Zn, Ca, Sr, or Ba.

A third conductivity type semiconductor layer (not illustrated) may be formed under the second conductivity type semiconductor layer 130. The third conductivity type semiconductor layer may be formed of a semiconductor having an opposite polarity with respect to the second conductivity type semiconductor layer 130. Also, if the first conductivity type semiconductor layer 110 is a P-type semiconductor layer, the second conductivity type semiconductor layer 130 may be an N-type semiconductor layer. The compound semiconductor layers 140 may be formed to have one of an N-P junction structure, a P-N junction structure, an N-P-N junction structure and a P-N-P junction structure. Hereinafter, for convenience in description, it is assumed that the lowermost layer of the compound semiconductor layers 140 is a second conductivity type semiconductor layer.

An ohmic layer 153, a channel layer 151 and an electrode layer 155 are formed under the second conductivity type semiconductor layer 130.

The ohmic layer 153 is disposed on an inner bottom side of the second conductivity type semiconductor layer 130. The ohmic layer 153 may be formed to have a predetermined shape of patterns spaced apart from each other. The ohmic layer 153 may be formed to have an arrayed pattern of a matrix shape, a cross shape, a polygonal shape, or a circular shape. The ohmic layer 153 may be formed of a material selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), ZnO, $IrO_x$, $RuO_x$, NiO, Ni/Au, metal oxide, and a combination thereof The ohmic layer 153 can increase the adhesive force between the second conductivity type semiconductor layer 130 and the electrode layer 155. Also, the ohmic layer 153 can improve the concentration of a current because it is disposed in a patterned shape to form a partial Schottky.

The channel layer 151 is disposed around the bottom surface of the compound semiconductor layers 140. The inside of the channel layer 151 is formed along the top surface of the second conductivity type semiconductor layer 130, and the outside of the channel layer 151 is formed outside the second conductivity type semiconductor layer 130. The channel layer 151 may be formed to have a frame shape, a pattern shape, a ring shape, or a loop shape. The channel layer 151 may be formed to have a continuous or a discontinuous shape. The channel layer 151 is disposed along between the second conductivity type semiconductor layer 130 and the electrode layer 155.

The channel layer 151 may be formed of an oxide-based transparent material or a nitride-based transparent material such as $SiO_2$, $SiO_x$, $SiO_xN_y$, $Si_3N_4$, $Al_2O_3$, ITO, IZO, IZTO, IAZO, IGZO, IGTO, AZO, and ATO. Because the channel layer 151 does not transmit a laser beam irradiated in an isolation etching process, it does not have an electrical influence on an outer region A1 of the compound semiconductor layers 140. If the channel layer 151 is formed of a conductive material, it can improve the electrical characteristics, thus improving the light emitting efficiency. The channel layer 151 can provide an interval between the electrode layer 155 and each layer of the compound semiconductor layers 140.

The channel layer 151 may include the above oxide-based or nitride-based material and may be formed to have a single layer structure or a multilayer structure.

The electrode layer 155 may be disposed under the second conductivity type semiconductor layer 130. The electrode layer 155 may be disposed under some or all of the bottom of the channel layer 151.

The electrode layer 155 may be formed of a material selected from the group consisting of Ag, Ni, Al, Rh, Pd, Ir, Ru, Mg, Zn, Pt, Au, Hf, and a combination thereof. The electrode layer 155 may be formed to include at least one layer.

A conductive support member 160 is formed under the electrode layer 155. The conductive support member may be formed of an alloy based on at least two of Ni, Cu, Cr, Fe, Si, Mo and Co, which have a similar thermal expansion coefficient to a semiconductor, high thermal conductivity and good conductive characteristics. The conductive support member 160 may be formed of an alloy containing 50% or more Ni. For example, the conductive support member 160 may be formed of at least one of Ni—Cu based alloy, Ni—Fe based alloy, Ni—Mo based alloy, Ni—Mo—Cr based alloy, Ni—Cr based alloy, Ni—Fe—Cu based alloy, Ni—Co—Mn based alloy, Ni—Cr—Fe based alloy, Ni—Cr—Mo—Cu based alloy and Ni—Si based alloy. For example, the conductive support member 160 may be formed of a material (e.g., a Ni—Co based alloy) that has an identical or similar thermal expansion coefficient to the compound semiconductor (e.g., GaN).

The GaN-based semiconductor layer may have a thermal expansion coefficient of about $a=5.25\sim7.75\times10^{-6}$/K, $c=4.52\times10^{-6}$/K. For example, the conductive support member 160 may have a thermal expansion coefficient difference within a critical range of about 50% with respect to the GaN-based semiconductor layer. The conductive support member 160 may have a thermal expansion coefficient of about 1~9×$10^{-6}$/K and may have a thickness of about 30~300 μm.

The conductive support member 160 may be formed of a Ni-based alloy that has a thermal expansion coefficient of about 5.2~8.91×$10^{-6}$/K. The unit of the thermal expansion coefficient may be /K, /degree, or μm/mK, to which the inventive concept is not limited.

The conductive support member 160 may be formed to include a magnetic material selectively. Herein, if the conductive support member 160 is formed of a material (e.g., a copper material) that has a higher thermal expansion coefficient than the nitride semiconductor, the copper support member has a higher thermal expansion coefficient than the nitride semiconductor. The copper support member is thermally/electrically unstable, thus degrading the device reliability.

The conductive support member 160 of the embodiment may be formed of a material that has an identical or similar thermal expansion coefficient to a compound semiconductor. The conductive support member 160 can minimize the thermal expansion problem of the conductive support member 160 caused by a temperature change. The conductive support member 160 has a material having a thermal expansion coefficient difference within about 5×$10^{-6}$/K with respect to the compound semiconductor layer.

FIGS. 2 to 9 are views illustrating a process of fabricating the semiconductor light-emitting device of FIG. 1.

Figure 2:
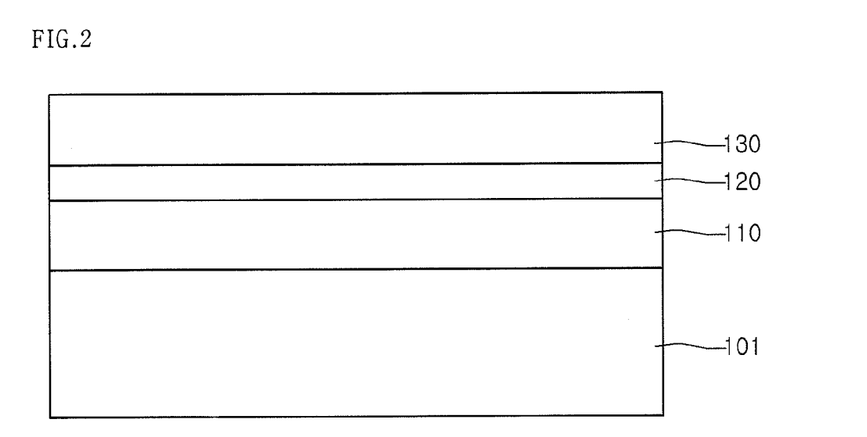
FIGS. 2 to 9 are views illustrating a process of fabricating a semiconductor light-emitting device according to an first embodiment.

Referring to FIG. 2, a first conductivity type semiconductor layer 110 is formed on a substrate 101. An active layer 120 is formed on the first conductivity type semiconductor layer 110. A second conductivity type semiconductor layer 130 is formed on the active layer 120.

The substrate 101 may be formed of at least one of sapphire ($Al_2O_3$), SiC, Si, GaAs, GaN, ZnO, GaP, InP and Ge. The substrate 101 may include a conductive substrate or a dielectric substrate. A rough pattern may be formed on and/or under the substrate 110. The shape of the rough pattern may include one of a stripe pattern, a lens pattern, a pillar pattern and a horn pattern.

A Group II to VI compound semiconductor may be grown on the substrate 101. The growth equipment may be an electron beam evaporator, a PVD (physical vapor deposition) device, a CVD (chemical vapor deposition) device, a PLD (plasma laser deposition) device, a dual-type thermal evaporator, a sputtering device, or a MOCVD (metal organic chemical vapor deposition) device, to which the inventive concept is not limited.

A buffer layer may be formed on the substrate 101. The buffer layer may be formed of a Group III-V compound semiconductor, for example, at least one of GaN, InN, AlN, InGaN, AlGaN, InAlGaN, and AlInN. Also, the buffer layer may be formed of a Group II to VI compound semiconductor, for example, a layer or a plurality of patterns of an oxide material such as ZnO.

An undoped semiconductor layer may be formed on the buffer layer or the substrate 101. The undoped semiconductor layer may be formed of an undoped GaN-based semiconductor. The buffer layer and/or the undoped semiconductor layer may not be formed or may not exist in the final device.

A plurality of compound semiconductor layers may be formed on the substrate 101. The compound semiconductor layers may include a stack structure of a first conductivity type semiconductor layer 110, an active layer 120 and a second conductivity type semiconductor layer 130 that are formed of a Group III-V compound semiconductor.

The first conductivity type semiconductor layer 110 may be formed of a Group III-V compound semiconductor doped with a first conductivity type dopant, for example, at least one selected from the group consisting of GaN, AlN, AlGaN, InGaN, InN, InAlGaN, AlInN, AlGaAs, GaP, GaAs, GaAsP, and AlGaInP. If the first conductivity type is an N type, the first conductivity type dopant may include an N-type dopant such as Si, Ge, Sn, Se, and Te. The first conductivity type semiconductor layer 110 may be formed in a single-layer structure or a multi-layer structure, to which the inventive concept is not limited.

The active layer 120 may be formed on the first conductivity type semiconductor layer 110. The active layer 120 may be formed in a single quantum well (SQW) structure or a multiple quantum well (MQW) structure. The active layer 120 may be formed of a group III-V compound semiconductor material to have a period of a well layer and a barrier layer, for example, a period of InGaN well layer/GaN barrier layer or a period of InGaN well layer/AlGaN barrier layer, to which the inventive concept is not limited. A conductive clad layer may be formed on and/or under the active layer 120. The conductive clad layer may be formed of a GaN-based semiconductor.

The second conductivity type semiconductor layer 130 may be formed on the active layer 120. The second conductivity type semiconductor layer 130 may be formed of a Group III-V compound semiconductor doped with a second conductivity type dopant, for example, at least one selected from the group consisting of GaN, AlN, AlGaN, InGaN, InN, InAlGaN, AlInN, AlGaAs, GaP, GaAs, GaAsP, and AlGaInP. If the second conductivity type is a P type, the second conductivity type dopant may include a P-type dopant such as Mg, Ze, Ca, Sr, and Ba. The second conductivity type semiconductor layer 130 may be formed in a single-layer structure or a multi-layer structure, to which the inventive concept is not limited.

A third conductivity type semiconductor layer (not illustrated) may be formed on the second conductivity type semiconductor layer 130. The third conductivity type semiconductor layer may be formed of a semiconductor having an opposite polarity to the second conductivity type semiconductor layer 130. Accordingly, the compound semiconductor layers may include at least one of an N-P junction structure, a P-N junction structure, an N-P-N junction structure, and a P-N-P junction. Hereinafter, for convenience in description, it is assumed that the uppermost layer of the compound semiconductor layers is a second conductivity type semiconductor layer.

Figure 3:
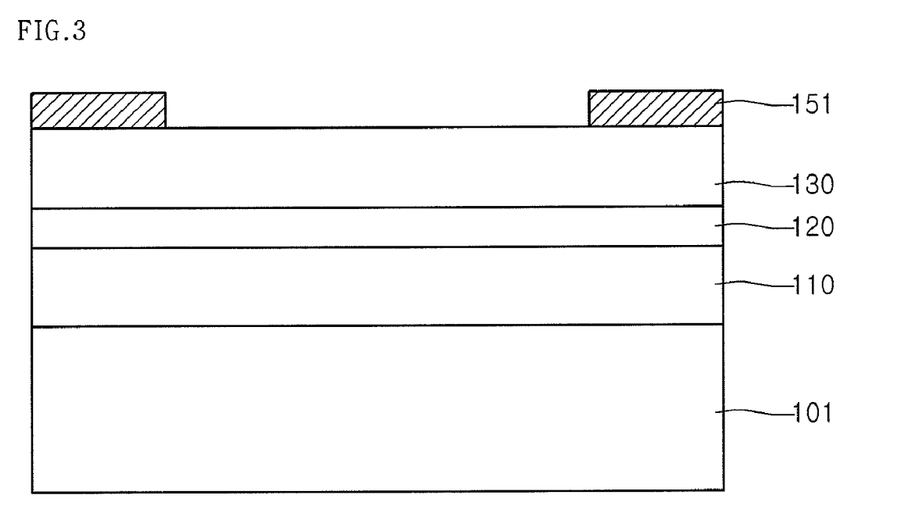
Figure 5:
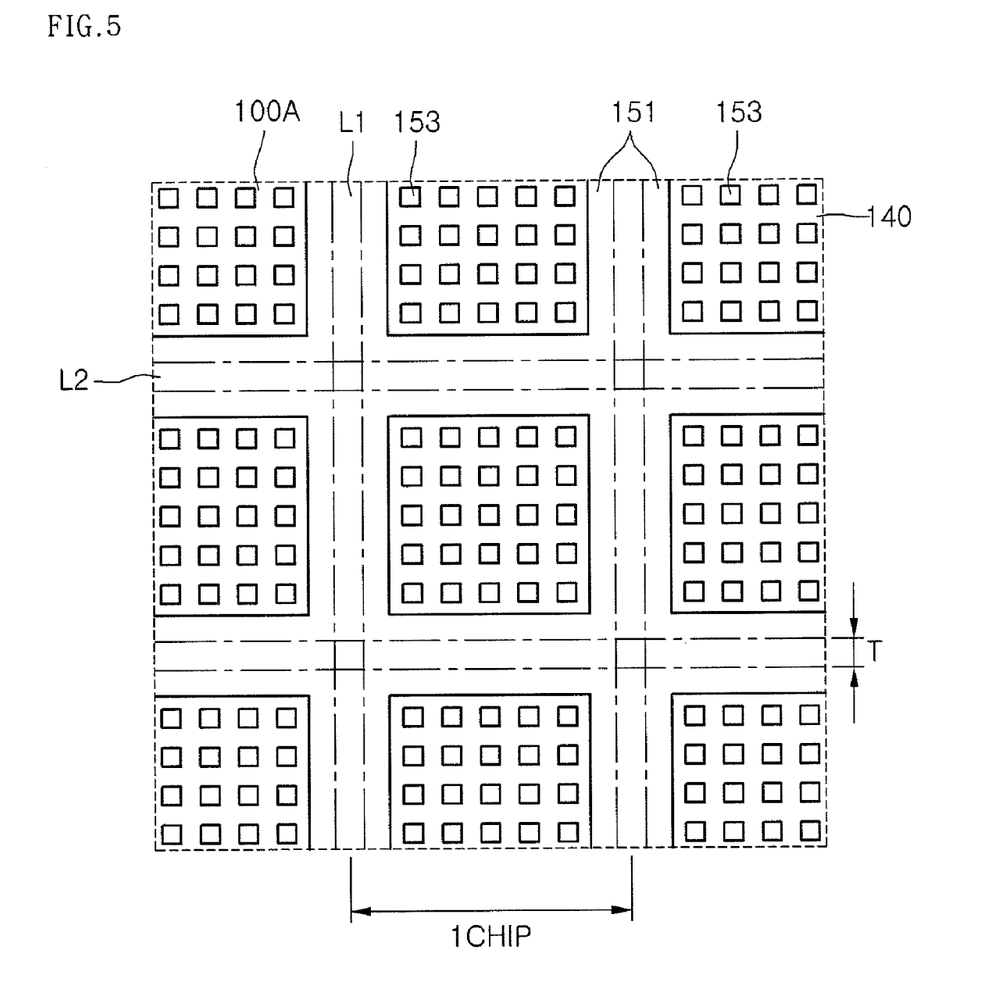

Referring to FIG. 3, a channel layer 151 is formed on an outer top of the second conductivity type semiconductor layer 130. As illustrated in FIG. 5, when it is divided by a predetermined width T along boundary regions L1 and L2 for each chip 100A, the channel layer 151 is formed on an edge region of the second conductivity type semiconductor layer 130.

The channel layer 151 may be formed of a transparent oxide material or a transparent nitride material, for example, at least one selected from the group consisting of ITO, IZO, IZTO, IAZO, IGZO, IGTO, AZO, ATO, $SiO_2$, $SiO_x$, SiOxNy, $Si_3N_4$ and $Al_2O_3$. A partial material of the channel layer 151 prevents an electrical influence on the outer region of the compound semiconductor layers 110, 120 and 130. The channel layer 151 may provide an interval between the electrode layer and the second conductivity type semiconductor layer 130.

Figure 4:
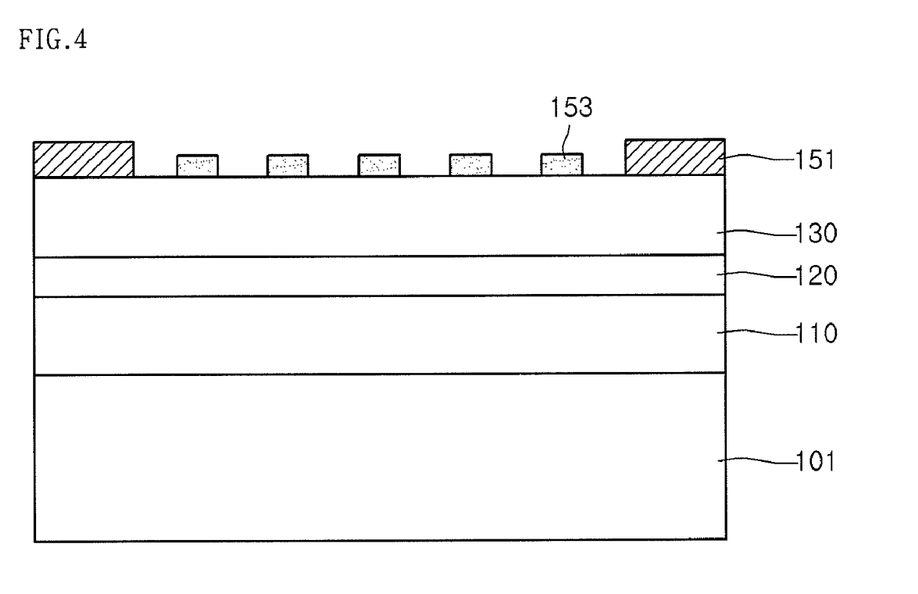

Referring to FIG. 4, an ohmic layer 153 is formed on an inner top of the second conductivity type semiconductor layer 130. As illustrated in FIG. 5, the ohmic layer 153 may be formed in a matrix pattern or in a zigzag pattern, the shape of which may be a polygonal shape, a cross shape, or a circular shape. The ohmic layer 153 may be formed of at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), ZnO, $IrO_x$, $RuO_x$, NiO, Ni/Au and metal oxide.

The channel layer 151 and the ohmic layer 153 may be formed using a predetermined mask pattern, and the forming order of the two layers may vary according to embodiments.

Figure 6:
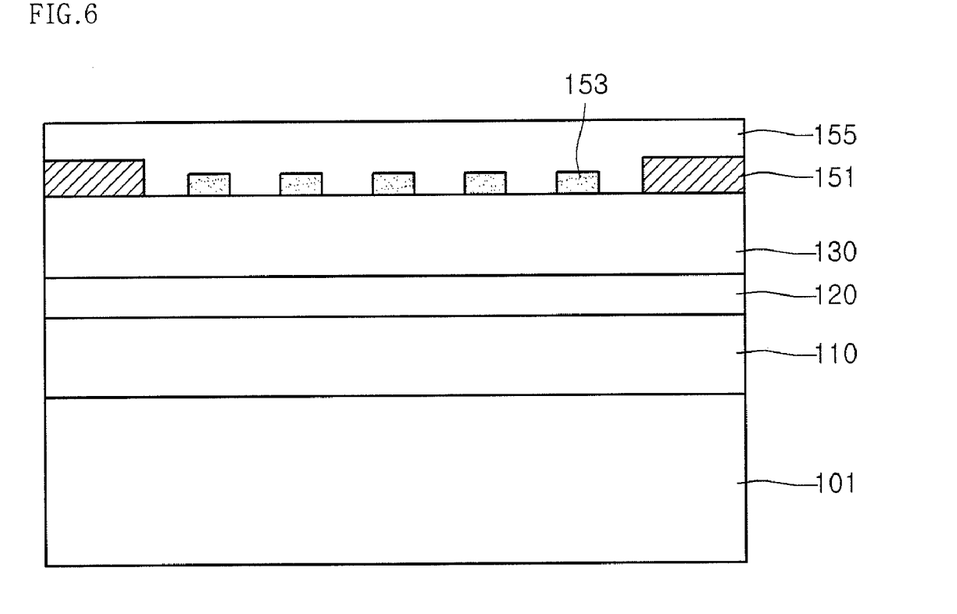
Figure 7:
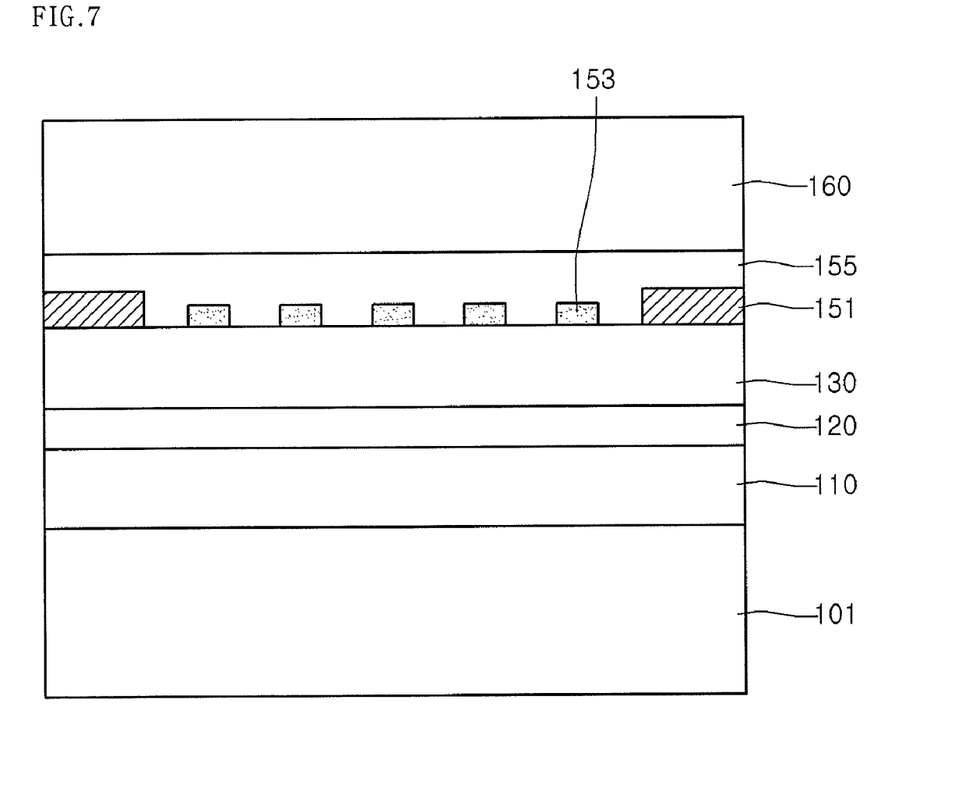

Referring to FIGS. 6 and 7, an electrode layer 155 is formed on the second conductivity type semiconductor layer 130, the channel layer 151 and the ohmic layer 153. A conductive support member 160 is formed on the electrode layer 155.

The electrode layer 155 may be formed to include at least one layer formed of one selected from the group consisting of Ag, Ni, Al, Rh, Pd, Ir, Ru, Mg, Zn, Pt, Au, Hf, and a combination thereof. The conductive support member 160 may be formed through an electrolytic plating process. The conductive support member 160 may be formed of an alloy based on at least two of Ni, Cu, Cr, Fe, Si, Mo and Co, which have a low thermal expansion coefficient, a high thermal conductivity and good conductive characteristics.

For example, the conductive support member 160 may be formed of at least one selected from the group consisting of Ni—Cu based alloy, Ni—Fe based alloy, Ni—Mo based alloy, Ni—Mo—Cr based alloy, Ni—Cr based alloy, Ni—Fe—Cu based alloy, Ni—Co—Mn based alloy, Ni—Cr—Fe based alloy, Ni—Cr—Mo—Cu based alloy, and Ni—Si based alloy. Also, the conductive support member 160 may be formed to include a magnetic material selectively. For example, the conductive support member 160 may be formed of a material (e.g., a Ni—Co based alloy) that has an identical or similar thermal expansion coefficient to the GaN-based compound semiconductor.

If the GaN-based semiconductor has a thermal expansion coefficient of about 3~7 μm/KA, the conductive support member 160 may be formed of a material (i.e., an alloy material of 3~9 μm/KA) that has a thermal expansion coefficient difference within a critical range of less than about 5 with respect to the GaN-based semiconductor.

Figure 8:
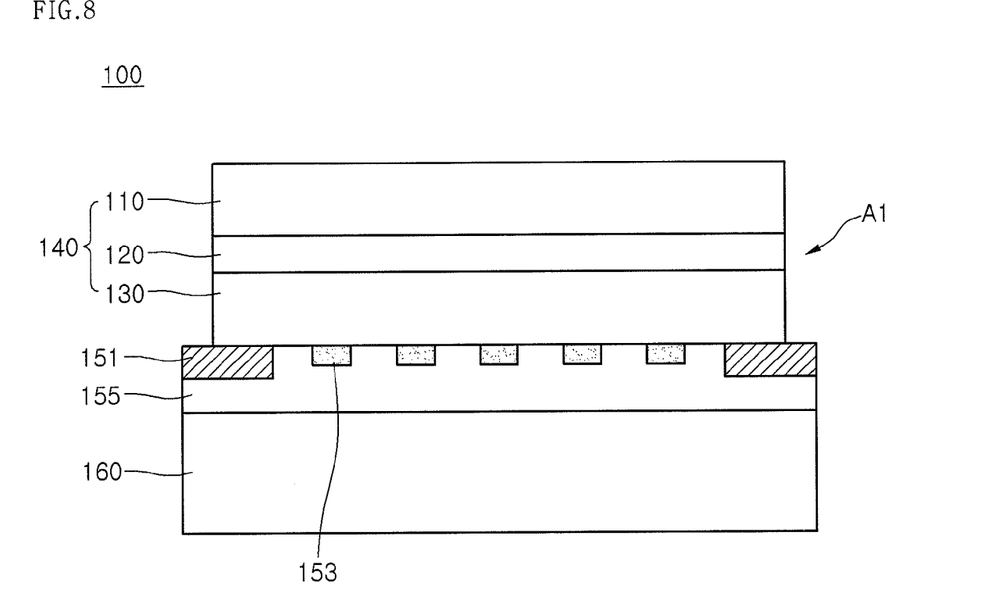

Referring to FIGS. 7 and 8, the substrate 101 formed under the first conductivity type semiconductor layer 110 may be removed through a laser lift off (LLO) process. When a laser beam with a predetermined wavelength is irradiated onto the substrate 101, thermal energy is concentrated on the interface between the substrate 101 and the semiconductor layer to separate the substrate 101. If another semiconductor layer (e.g., a buffer layer) is present between the substrate 101 and the first conductivity type semiconductor layer 110, the substrate 101 may be removed through a wet etching process.

Thereafter, an ICP/RIE (Inductively coupled Plasma/Reactive Ion Etching) process may be performed on the surface of the first conductivity type semiconductor layer 110 without the substrate 101.

The ohmic layer 153 increases the adhesive force between the second conductivity type semiconductor layer 130 and the electrode layer 155, thus protecting it from the impact transferred between the second conductivity type semiconductor layer 130 and the electrode layer 155. Accordingly, the reliability of the semiconductor light-emitting device can be improved.

After the substrate 101 is removed, an isolation etching process is performed to expose a partial surface of the channel layer 151 that is a chip boundary region. Herein, the etching process may be a wet or dry etching process.

If the channel layer 151 is formed of a conductive material, the isolation layer etching process prevents the semiconductor material from flowing down to another layer, thus preventing an electrical short. That is, the process stability can be improved. Also, the light emitting efficiency can be improved by the ohmic characteristics of the channel layer 151.

If the channel layer 151 is formed of a dielectric material, it can provide a spatial interval between the electrode layer 155 and the second conductivity type semiconductor layer 130.

Figure 9:
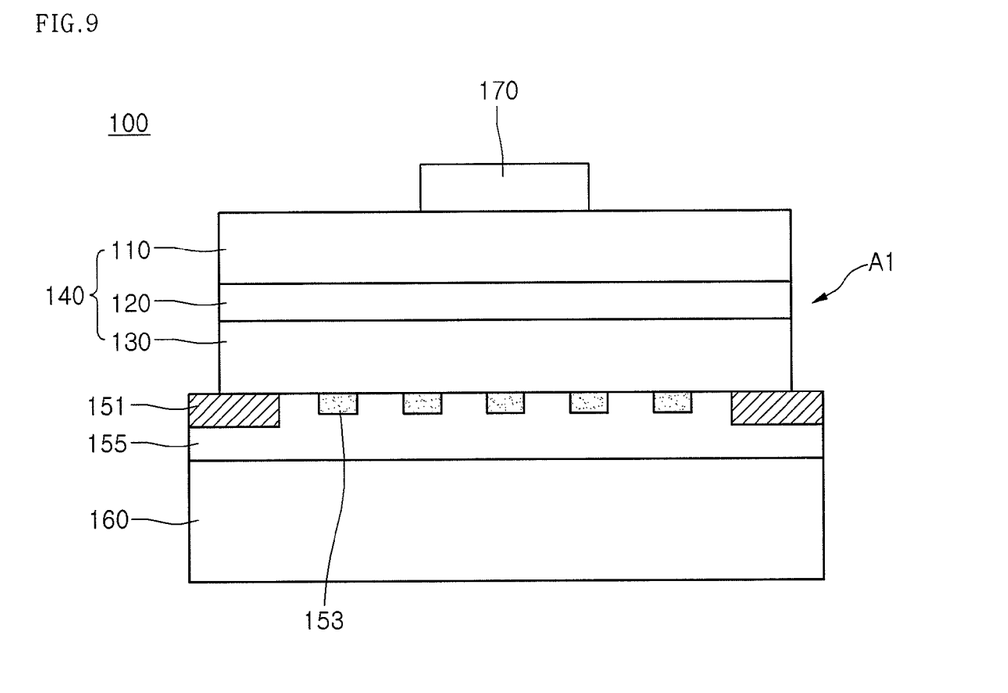

Referring to FIGS. 8 and 9, an electrode 170 of a predetermined pattern may be formed on the first conductivity type semiconductor layer 110. A roughness may be formed on the top surface of the first conductivity type semiconductor layer 110.

The semiconductor light-emitting device 100 includes a conductive support member 160 that is disposed under the compound semiconductor layers 140 (110, 120 and 130) and has a small thermal expansion coefficient difference with respect to the GaN-based semiconductor. Because the conductive support member 160 has a small thermal expansion coefficient difference with respect to the semiconductor material, it can improve the thermal reliability and stability of the semiconductor light-emitting device 100.

Figure 10:
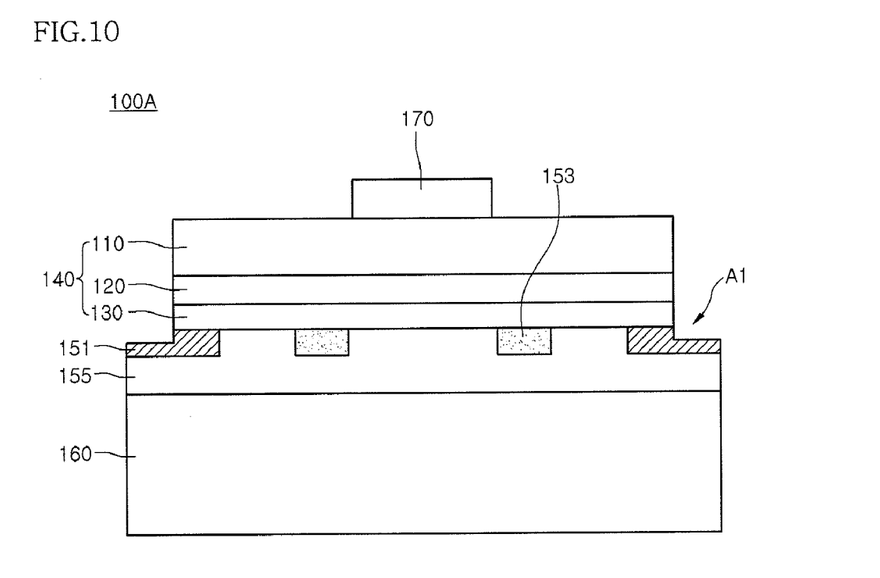
FIG. 10 is a side sectional view of a semiconductor light-emitting device according to a second embodiment.

FIG. 10 is a side sectional view of a semiconductor light-emitting device according to a second embodiment. In describing the second embodiment, a description of an overlap with the first embodiment will be omitted for conciseness.

Referring to FIG. 10, a semiconductor light-emitting device 100A is configured to include an ohmic layer 153 disposed between a second conductivity type semiconductor layer 130 and an electrode layer 155.

The channel layer 151 may have different thicknesses in the inner and outer sides. The inner side of the channel layer 151 contacts a bottom edge of the second conductivity type semiconductor layer 130 and the outer side of the channel layer 151 is exposed to the outside of the second conductivity type semiconductor layer 110. The inner and outer sides of the channel layer 151 may be formed to have a step difference.

The ohmic layer 153 may be formed at the position corresponding to the electrode 170, to which the inventive concept is not limited.

Figure 11:
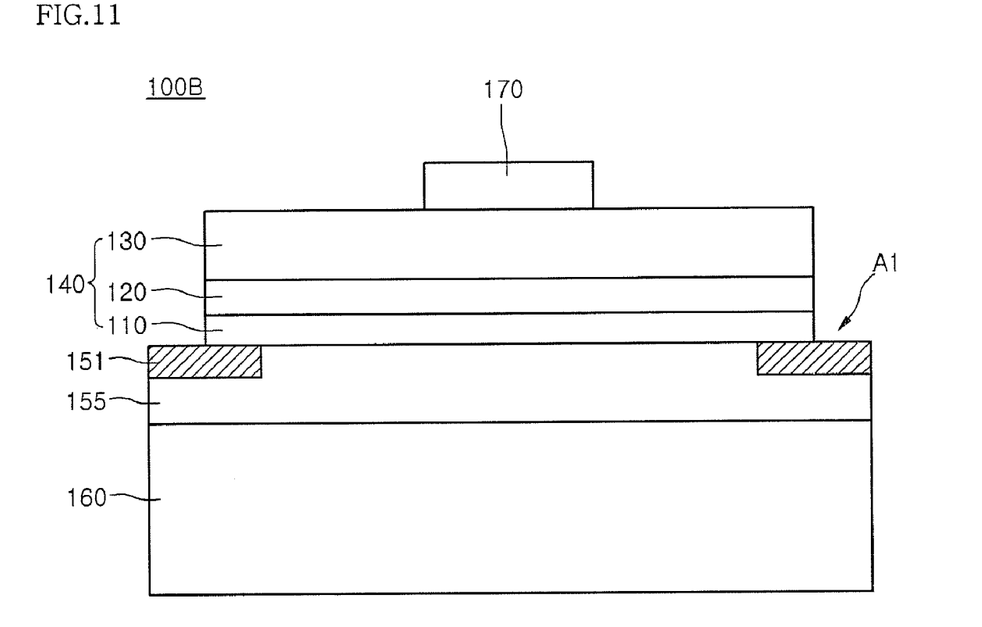
FIG. 11 is a side sectional view of a semiconductor light-emitting device according to a third embodiment.

FIG. 11 is a side sectional view of a semiconductor light-emitting device according to a third embodiment. In describing the third embodiment, a description of an overlap with the first embodiment will be omitted for conciseness.

Referring to FIG. 11, a semiconductor light-emitting device 100B is configured to include a channel layer 151 disposed between an electrode layer 155 and an outer edge of a second conductivity type semiconductor layer 130. The channel layer 151 may be formed of a dielectric material.

The electrode layer 155 may be formed of a seed metal material under the second conductivity type semiconductor layer 130 to have reflective characteristics and ohmic contact characteristics. The electrode layer 155 may be formed of at least one of Ag, Ag alloy, Ni, Al, Al alloy, Rh, Pd, Ir, Ru, Mg, Zn, Pt, Au, Hf, and an alloy thereof. The electrode layer 155 may be formed to have a single layer structure or a multilayer structure.

Figure 12:
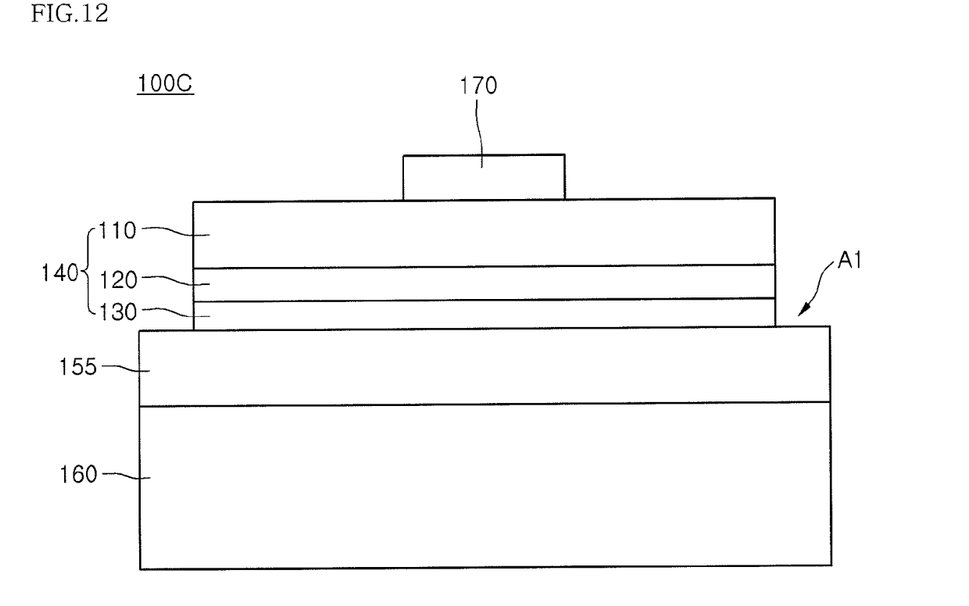
FIG. 12 is a side sectional view of a semiconductor light-emitting device according to a fourth embodiment.

FIG. 12 is a side sectional view of a semiconductor light-emitting device according to a fourth embodiment. In describing the fourth embodiment, a description of an overlap with the first embodiment will be omitted for conciseness.

Referring to FIG. 12, a semiconductor light-emitting device 1000 is configured to include an electrode layer 155 formed under a second conductivity type semiconductor layer 130 without forming other material layers.

The electrode layer 155 may include at least one of Ag, Ag alloy, Ni, Al, Al alloy, Rh, Pd, Ir, Ru, Mg, Zn, Pt, Au, Hf, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni/$IrO_x$/Au, and Ni/$IrO_x$/Au/ITO. The electrode layer 155 may be formed of a reflective material or may include a stack structure of a transparent material and a reflective material.

Figure 13:
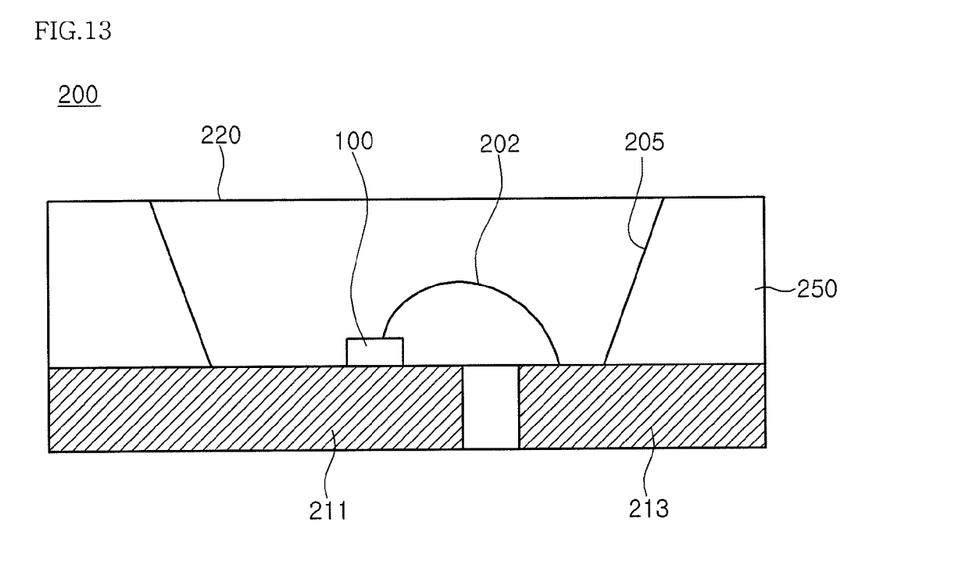
FIG. 13 is a side sectional view of a semiconductor light-emitting package according to a fifth embodiment.

FIG. 13 is a side sectional view of a semiconductor light-emitting package according to a fifth embodiment.

Referring to FIG. 13, a semiconductor light-emitting package 200 includes: a body portion 250; first and second lead electrodes 211 and 213 disposed in the body portion 250; a light-emitting device 100 disposed in the body portion 250 to be electrically connected to the first and second lead electrodes 211 and 213; and a molding member 220 surrounding the light-emitting device 100.

The body portion 250 may be formed of at least one of a silicon material, a synthetic resin material and a metal material. The body portion 250 may formed by a cavity 205 with an inclined surface at the periphery of the light-emitting device 100.

The first lead electrode 211 and the second lead electrode 213 are electrically disconnected from each other, and provide power to the light-emitting device 100. Also, the first lead electrode 211 and the second lead electrode 213 reflect the light emitted from the light-emitting device 100, thus improving the light emitting efficiency. Also, the first lead electrode 211 and the second lead electrode 213 may serve to discharge the heat generated from the light-emitting device 100.

The light-emitting device 100 may be disposed on the body portion 250 or may be formed on the first lead electrode 211 or the second lead electrode 213.

The light-emitting device 100 may be electrically connected through a wire 202 to the second lead electrode 213, and may be connected to the first lead electrode 211 in a die bonding structure.

The molding member 220 may surround the light-emitting device 100 to protect the light-emitting device 100. Also, the molding member 220 may include a fluorescent material to change the wavelength of light emitted from the light-emitting device 100.

The light-emitting device 100 may be electrically connected through a via hole formed in the body portion 250.

The light-emitting device according to the embodiment may be connected to the first and second lead electrodes 211 and 213, packaged and used as a light source for an indication device, an illumination device, or a display device. Also, each embodiment is not limited to each embodiment and may be selectively applied to another embodiment.

The embodiment reduces the thermal expansion coefficient between the nitride semiconductor and the support member, thereby improving the reliability of the semiconductor light-emitting device. The embodiment uses the support member that has a thermal expansion coefficient difference within a critical range with respect to the nitride semiconductor, thereby improving the thermal stability of the semiconductor light-emitting device.

The semiconductor light-emitting device according to an embodiment includes: a light-emitting structure including a plurality of Group III-V compound semiconductor layers; a second electrode layer under the light-emitting structure; and a conductive support member that is disposed under the second electrode layer and has a thermal expansion coefficient difference less than about 5 with respect to the compound semiconductor.

A method for fabricating a semiconductor light-emitting device according to an embodiment includes: forming a plurality of compound semiconductor layers on a substrate; forming an electrode layer on the compound semiconductor layers; forming a conductive support member under the electrode layer to have a thermal expansion coefficient difference within a critical range; removing the substrate; and forming an electrode under the compound semiconductor layers.

Another embodiment provides a lighting system which comprises the light emitting device described above. The lighting system may include lamp, street light, light unit not limited thereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light-emitting device, comprising:
a plurality of compound semiconductor layers comprising a first conductivity type semiconductor layer, an active layer and a second conductivity type semiconductor layer;
an electrode on the plurality of compound semiconductor layers;
an electrode layer comprising a reflective material under the plurality of compound semiconductor layers;
an oxide or nitride based channel layer around between the electrode layer and the plurality of compound semiconductor layers; and
a conductive support member under the electrode layer,
wherein the conductive support member comprises an alloy material with a thermal expansion coefficient of about $1\sim9\times10^{-6}$/K,
wherein the conductive support member is formed of a Ni-alloy layer containing at least one element selected from the group consisting of Cr, Fe, Si, and Mo, and
wherein an inside portion of the channel layer is disposed under the plurality of compound semiconductor layers, and an outside portion of the channel layer has a different thickness from the inside portion of the channel layer and is exposed to an outside of the plurality of compound semiconductor layers.

2. The semiconductor light-emitting device according to claim 1, wherein the plurality of compound semiconductor layers comprise a Group III-V compound semiconductor layer with a thermal expansion coefficient of about $5.25\sim7.75\times10^{-6}$/K.

3. The semiconductor light-emitting device according to claim 1, comprising an ohmic layer forming an ohmic contact between the electrode layer and the second conductivity type semiconductor layer.

4. The semiconductor light-emitting device according to claim 1, wherein the electrode layer comprises at least one of Ag, Ag alloy, Ni, Al, Al alloy, Rh, Pd, Ir, Ru, Mg, Zn, Pt, Au, Hf, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni/$IrO_x$/Au and Ni/$IrO_x$/Au/ITO.

5. The semiconductor light-emitting device according to claim 1, wherein the conductive support member comprises at least one of Ni—Fe based alloy, Ni—Mo based alloy, Ni—Mo—Cr based alloy, Ni—Cr based alloy, Ni—Cr—Fe based alloy, and Ni—Si based alloy.

6. The semiconductor light-emitting device according to claim 1, wherein the conductive support member has a thickness of 30 μm-300 μm.

7. The semiconductor light-emitting device according to claim 1, wherein the plurality of compound semiconductor layers comprise:
   a first conductivity type semiconductor layer with an electrode;
   an active layer under the first conductivity type semiconductor layer; and
   a second conductivity type semiconductor layer under the active layer.

8. The semiconductor light-emitting device according to claim 1, wherein the plurality of compound semiconductor layers comprise a Group III-V compound semiconductor material.

9. The semiconductor light-emitting device according to claim 1, wherein the conductive support member is formed in a single layer.

10. The semiconductor light-emitting device according to claim 1, wherein the conductive support member comprises an alloy having a thermal expansion coefficient difference within about 50% with respect to the plurality of compound semiconductor layers.

* * * * *